United States Patent [19]

Van Dine

[11] 4,394,647
[45] Jul. 19, 1983

[54] VOLTAGE MONITORING ARRANGEMENT FOR ORED POWER DIODES

[75] Inventor: Gilbert A. Van Dine, Winfield Township, Du Page County, Ill.

[73] Assignee: Bell Telephone Laboratories, Incorporated, Murray Hill, N.J.

[21] Appl. No.: 301,960

[22] Filed: Sep. 14, 1981

[51] Int. Cl.³ .......................................... G08B 21/00
[52] U.S. Cl. ................................... 340/645; 179/77; 324/133; 340/650; 340/651
[58] Field of Search ............... 340/636, 638, 645, 650, 340/651, 652, 825.94, 333; 324/133; 307/311; 179/70, 77, 16 F, 170 J

[56] References Cited

U.S. PATENT DOCUMENTS

| | | | |
|---|---|---|---|
| 3,482,236 | 12/1969 | Seney | 324/133 UX |
| 3,508,139 | 4/1970 | Rummel | 324/133 UX |
| 3,662,369 | 5/1972 | Vinsani et al. | 340/638 |
| 3,696,367 | 10/1972 | Inamdar | 340/651 |
| 3,786,466 | 1/1974 | Naito et al. | 340/651 |
| 3,801,898 | 4/1974 | Young | 324/51 |
| 4,155,081 | 5/1979 | Haglund | 340/333 X |
| 4,209,671 | 6/1980 | Charles et al. | 324/133 X |
| 4,210,862 | 7/1980 | Koslar | 324/133 X |

OTHER PUBLICATIONS

Practical Electronics; vol. 17, No. 1; Jan. 1981; "Fuse Failure Indicator", by Rochfort; p. 72.

Primary Examiner—John W. Caldwell, Sr.
Assistant Examiner—Daniel Myer
Attorney, Agent, or Firm—F. W. Padden

[57] ABSTRACT

Each power diode in an ORed direct-current power distribution system has connected thereacross, between the respective load and source terminals of the power diode, a series connection of respective first and second light-emitting diodes (LEDs) with the LEDs being similarly poled with respect to their common connection, with the power diode and the first LED being oppositely poled with respect to the power diode load terminal, with a resistance connected between the common LED connection and the power supply return. A resistance-LED arrangement is also provided in parallel with each nonindicating fuse. The ON (fully conducting—showing detectable visible light) and OFF (not fully conducting—not showing detectable visible light) patterns of the LEDs, both under the condition of normal voltage on each power bus and under the condition where the relative voltage between buses is varied slightly, can be used for circuit failure diagnostics.

20 Claims, 7 Drawing Figures

VOLTAGE MONITORING ARRANGEMENT FOR ORED POWER DIODES

TECHNICAL FIELD

The technical field of the present invention is generally direct-current power distribution and particularly such distribution wherein a plurality of power sources supply power to common loads through ORed power diodes.

BACKGROUND OF THE INVENTION

The use of rectifier power diodes in a logical OR arrangement has been known for some time for supplying direct-current power from a plurality of power sources to one or more common loads. A long-standing problem in this area has been the difficulty of detecting failures of the power diodes without shutting down (that is, taking out of service) or incurring the risk of shutting down one or more of the loads.

In known ORed power distribution, such as is shown in FIG. 1 of the drawings herein, at least two separate power distribution buses are used with each separate bus being supplied with power from a separate power source, with each bus being connected through a separate fuse and a separate power diode so as to feed power to the same power terminal of at least one common load, and with the power sources and the common load having a common power supply return.

One known way of detecting failure of such power diodes is to turn off (that is, remove the power source from) each bus, one at a time, and to observe the consequences. An open power diode will cause the equipment it feeds to shut down as the opposite bus is turned off. If a power diode is shorted, one of at least two events will occur depending upon the amount of independent load supplied by the bus which is turned off. If the latter bus feeds only load connected through ORed power diodes, then a shorted power diode will not allow its associated bus voltage to drop very far when that bus is turned off. The problem then would be to ascertain which power diode on that bus is the one that is shorted and to do so without shutting down on-line equipment. If that bus feeds any substantial independent load in addition to the ORed load, then a fuse will be blown when that bus is turned off and the load associated with the shorted diode will be shut down.

As outlined above, periodic turning off of each of the two power buses separately will allow some degree of detection of failed power diodes, but only at the risk of shutting down on-line load equipment associated with a failed power diode. Also, in the latter regard, any load equipment independently supplied (that is, not commonly supplied from more than one bus through ORed power diodes) from a bus is also shut down during the test. Also, another problem attendant to such a test is the risk that rapid voltage and current transients associated with the bus turn-off and with the bus turn-on may introduce error signals.

For the foregoing reasons, and other reliability problems, it has not been common practice to provide turn-off capability for such power buses, thus leaving the art faced with solving the power diode failure detection problem by the tedious process of manually testing the various components of the system.

SUMMARY OF THE INVENTION

The present invention provides, for use with an ORed direct-current power distribution system, a voltage monitoring arrangement having voltage monitoring circuitry for at least one power diode whereby power diode failures can be detected without the need to shut down on-line load equipment and without the tedious testing of components. In the discussion which follows, the power diode has a direct-current voltage drop of $V_{PD}$ thereacross when fully conducting and a direct-current voltage drop of not greater than $v_{PD}$ when negligibly conducting. In other words, $v_{PD}$ is the maximum bias voltage which will produce negligible conduction. Lower or negative (reverse bias) voltage values all result in negligible current conduction.

In general, the voltage monitoring circuitry comprises a first two-terminal, unidirectionally-conducting circuit having a direct-current voltage drop of $V_{CD1}$ thereacross when fully conducting and a direct-current voltage drop of not more than $v_{CD1}$ thereacross when negligibly conducting, a second such circuit having similar respective voltage drops of $V_{CD2}$ and $v_{CD2}$, and a two-terminal, direct-current impedance. In addition, one terminal of each of the two circuits and of the impedance are connected together to define a common circuit node; and, the other terminals of the respective first and second circuits and impedance are connected respectively to the power diode load terminal, to the power diode source terminal, and to the power supply return. Also, the impedance is of such value as to limit to prescribed maxima the fully conducting amounts of current through the first and second circuits.

Further, each of the first and second circuits is a unidirectional, current-conducting circuit with the first and second circuits being similarly poled with respect to the common circuit node and with the power diode and the first circuit being oppositely poled with respect to the load terminal of the power diode.

More particularly, the first and second circuits comprise unidirectional, current-conducting devices, such as control diodes, and the respective $V_{CD1}$ and $V_{CD2}$ are the voltage drops across the respective circuits when the diodes are fully conducting.

More specifically, each of the respective first and second circuits consists solely of the respective first and second control diodes, at least one of which is a light-emitting diode, the ON (fully conducting) and OFF (negligibly conducting) conditions of which may be observed or measured as indicia of certain circuit conditions, including failure of the circuits' own components. It should be noted that the use of a light emitting diode is for the purpose of reliably detecting current conduction therethrough, but that other current detection means (e.g. current mirroring) will be obvious to those skilled in the art.

The invention makes it possible to evaluate any or all failure conditions, of either the power diodes or monitor circuit components, by use of a simple test procedure. This procedure consists of altering one or more of the source voltages slightly. The slight altering of a source of voltage does not comprise the shutdown of load equipment, since these are always designed to operate over a range of supply voltages. However, altering a source of voltage does allow enough of a change in the voltage conditions at the two power diode terminals so that the first and second circuits can exhibit enough voltage changes thereacross to be indicative of failure conditions. In accord with this invention, a relationship exists among the variation in supply voltage allowed by load equipment design, the test voltage change, and the component voltage values, such that the test voltage change can be designed to be less than that allowed in the equipment design. This relationship is defined in the subsequent section entitled, "Circuit Equations."

BRIEF DESCRIPTION OF THE DRAWINGS

The drawings consist of three sheets making up FIGS. 1 through 7, with respect to which the following are brief descriptions.

DETAILED DESCRIPTION

Figure 1:
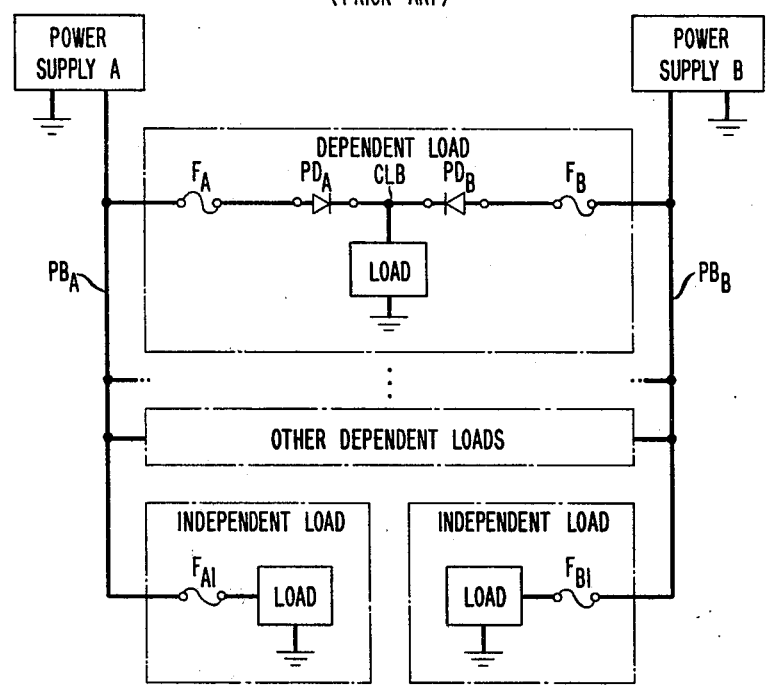
FIG. 1 represents the prior art.

FIG. 1 shows the circuitry of a typical prior art direct-current power distribution system using ORed power diodes. Power supplies A and B may illustratively provide direct-current voltages of plus 26 volts (+26.0) on their respective power buses $PB_A$ and $PB_B$. Also, power supplies A and B are connected to ground as a common power supply return. In addition, power buses $PB_A$ and $PB_B$ feed power to one or more independent loads through such as the fuses $FA_1$ and $FB_1$. Furthermore, power buses $PB_A$ and $PB_B$ feed power to one or more common or dependent loads through such as the fuses $F_A$ and $F_B$ and through such as the ORed power diodes $PD_A$ and $PD_B$, which are similarly poled for unidirectional current conduction therethrough from the power buses $PB_A$ and $PB_B$ to the common load terminals thereof (junction CLB) and through the common load to the common power supply return ground. In such an arrangement, each of fuses, $F_A$, $F_B$, $F_{A1}$, and $F_{B1}$ may illustratively exhibit a voltage drop thereacross of about 0.25 volt when fully conducting; and, each of the power diodes $PD_A$ and $PD_B$ may exhibit a voltage drop thereacross of about 1.5 volts when fully conducting and 0.6 volt when negligibly conducting. Thus, under normal circumstances (that is, for example, no fault conditions), the voltage at junction CLB is about plus 24.25 volts (that is, plus 26.0 minus 0.25 minus 1.5).

It is possible with the prior art circuitry of FIG. 1 to do some degree of fault diagnosis. For example, if the fuses are of the self-indicating type (that is, provide some indication, visual or otherwise, as to whether the fuse is either functioning properly or has become open-circuited), then it will be quite apparent whenever a fuse becomes open-circuited. On the other hand, if fuses $F_{A1}$ and $F_{B1}$ are not self-indicating, then the shutdown of an independent load could be a symptom of an open-circuited fuse. However, if fuses $F_A$ and $F_B$ in the ORed load circuit are not self-indicating, then an open fuse $F_A$ or $F_B$ would not cause shutdown of the common load since, as is the purpose of such power distribution systems, the other power bus would carry the load. Similarly, an open power diode $PD_A$ or $PD_B$ would not result in a shut-down of the common load. Furthermore, a short-circuited power diode $PD_A$ or $PD_B$ would not be apparent since the common load would be unaffected.

In FIG. 1, turning off of the power supplies A and B, one at a time, can provide additional diagnostic information. For example, if diode $PD_A$ is open-circuited and if bus $PB_A$ is turned off with bus $PB_B$ turned on, the common load remains on; whereas, if bus $PB_B$ is turned off with bus $PB_A$ turned on, the common load will be shut down, et cetera. Also, if diode $PD_A$ is short-circuited, one of two events will occur, depending upon the amount of independent load fed by bus $PB_A$ when it is turned off with bus $PB_B$ turned on. If bus $PB_A$ feeds only common load, the common load will remain fed by bus $PB_B$ and the short-circuited condition of diode $PB_A$ is not detected. If, however, each bus is equipped with a voltmeter or indicating light, the fact that one of the diodes associated with bus $PB_A$ is short-circuited is indicated by the failure of bus $PB_A$ to go to zero volts when it is shut off. However, the problem then remains to ascertain, without shutting down loads, which diode on bus $PB_A$ is the short-circuited one. On the other hand, if bus $PB_A$ feeds any substantial amount of independent load, then fuse $F_B$ will blow due to excessive current drain by the independent load through the short-circuited diode $PD_A$ when bus $PB_A$ is shut down.

The above-described necessity of turning off the two buses $PB_A$ and $PB_B$, one at a time, in order to diagnose possible failure conditions is undesirable since such action may blow fuses and/or otherwise cause the shut-down of operating loads.

Figure 2:
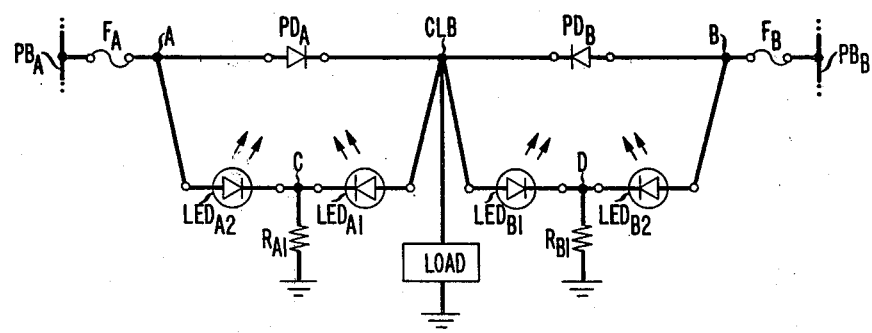
FIG. 2 shows how the invention may be embodied in FIG. 1.

FIG. 2 shows how circuitry according to the invention may be embodied in FIG. 1 to provide a way of diagnosing failure conditions without shutting down operating loads. In FIG. 2, the circuit parameters are the same as in FIG. 1 except that light-emitting diodes $LED_{A1}$ and $LED_{A2}$ and resistance $R_{A1}$ have been connected as shown for power diode $PD_A$ and except that light-emitting diodes $LED_{B1}$ and $LED_{B2}$ and resistance $R_{B1}$ have been connected as shown for power diode $PD_B$. Each of $LED_{A1}$, $LED_{B1}$ exhibits a fully conducting voltage drop of 1.3 volts and $LED_{A2}$ and $LED_{B2}$ exhibits a fully-conducting voltage drop of about 2.25 volts, at which bias each of the four LEDs exhibits easily detectable light emission; they will not emit detectable light if the voltage thereacross is 0.9 and 1.5 volts or less respectively. The normal voltage drop in each of fuses $F_A$ and $F_B$ is about 0.25 volt; the normal fully conducting voltage drop in each of the power diodes $PD_A$ and $PD_B$ is about 0.5 volts; each of resistances $R_{A1}$ and $R_{B1}$ is nominally 2,400 ohms assuming a fully conducting current maximum of about 10 milliamperes (ma) in either of the LEDs controlled by that resistance RA1; and, each of the power supplies A and B provides on its power bus $PB_A$ or $PB_B$ a nominal voltage of plus 26.0 volts (+26.0).

Under normal conditions the voltage on each of the buses $PB_A$ and $PB_B$ is +26.0; the voltage on each of the circuit nodes A and B is +25.75, taking into account the 0.25 volt drop in each of fuses $F_A$ and $F_B$; and, the voltage on circuit lead CLB is +24.25, taking into account the 1.5 volt drop in each of the power diodes $PD_A$ and $PD_B$. $LED_{A2}$ and $LED_{B2}$ will be fully conducting (that is, they will be ON and emitting visible light) with a voltage drop across each one of 2.25 volts, thus establishing at each of the circuit nodes C and D, a voltage of +23.50. Since there is only 0.75 volt across each of LED$_{A1}$ and LED$_{B1}$ (nodes C and D at +23.50 and lead CLB at +24.25), the latter will not be conducting sufficiently to emit detectable visible light (that is, they will be OFF). Thus, the combination of LED$_{A1}$ and LED$_{B1}$ OFF (not fully conducting—not providing detectable visible light) and of LED$_{A2}$ and LED$_{B2}$ ON (fully conducting—producing detectable visible light) would prevail if no fault exists in the circuitry. Such a combination of ON and OFF LEDs, however, also could represent a condition whereunder either diode PD$_A$ is open-circuited, or diode PD$_B$ is open-circuited, or both diodes PD$_A$ and PD$_B$ are open-circuited.

The above latter ambiguities can be resolved by slightly altering the voltage of one or both of the power buses PB$_A$ and PB$_B$ so that one bus is about 2 volts more positive than or more negative than the other bus. Such a slight alteration (2 volts compared to 26.0 volts) of the relative voltages on the power buses PB$_A$ and PB$_B$ will not cause the shutdown of operating loads but can cause a change in the ON and OFF pattern of the LEDs such that particular faults may be diagnosed from such changes in the ON and OFF LED pattern. For example, if the voltage on bus PB$_A$ is lowered to +24.0 volts, node A at the source terminal (left) of the open-circuited diode PD$_A$ will drop to 24.0 volts. (The drop across F$_A$ is now zero since all load current is now supplied via PD$_B$ and F$_B$, the latter of which now has a drop of 0.5 volts due to the increased current.) This latter drop, plus that of PD$_B$, causes lead CLB to be at the same voltage (24.0 v). LED$_{A1}$ will now be fully conducting with a voltage drop of 1.3 volts to render node C at +22.7 volts so that LED$_{A2}$ cannot fully conduct (only 1.3 volts thereacross), thus causing LED$_{A1}$ to provide detectable visible light and causing LED$_{A2}$ not to provide detectable visible light. It will be apparent at this point that the specific voltages which have been used for illustrative purposes may individually have different values so long as their relationships are maintained. These relationships are delineated in the subsequent section entitled "Circuit Equations." However, in the above instance where PB$_A$ is lowered to 24.0 volts the indication pattern will be different if diode PD$_B$ should be open-circuited: LED$_{A2}$ will not extinguish, and LED$_{A1}$ will not turn on. An open-circuited PD$_A$ is similarly detected when PB$_B$ is lowered.

Some fault conditions will be indicated by this arrangement even with normal (+26.0) voltage on both buses PB$_A$ and PB$_B$ as will be apparent: LED$_{A1}$ and LED$_{B2}$ ON with LED$_{B1}$ and LED$_{A2}$ OFF indicates that fuse F$_A$ is open-circuited; LED$_{B1}$ and LED$_{A2}$ ON with Led$_{A1}$ and LED$_{B2}$ OFF indicates that fuse F$_B$ is open-circuited; all four LEDs OFF indicates that both of fuses F$_A$ and F$_B$ are open-circuited. LED$_{A1}$ and LED$_{B1}$ ON with LED$_{A2}$ and LED$_{B2}$ OFF indicates that either diode PD$_A$ or diode PD$_B$ is short-circuited, or each of diodes PD$_A$ and PD$_B$ is short-circuited. Again, the latter ambiguity can be resolved by altering the relative voltage between the power buses by about 2 volts to allow a significant change in the ON and OFF pattern of the LEDs.

The foregoing ON and OFF patterns of the LEDs of FIG. 2, with normal +26.0 volts on each power bus, is summarized in the following table where a zero (0) signifies an OFF condition of an LED and a cross (X) signifies an ON condition of an LED.

|  | LED$_{A1}$ | LED$_{A2}$ | LED$_{B1}$ | LED$_{B2}$ | Note |
|---|---|---|---|---|---|
| (1) | 0 | X | 0 | X | Note 1 |
| (2) | X | 0 | 0 | X | F$_A$ open |
| (3) | 0 | X | X | 0 | F$_B$ open |
| (4) | 0 | 0 | 0 | 0 | F$_A$ and F$_B$ open |
| (5) | X | 0 | X | 0 | Note 2 |

Note 1: Either no fault, or PD$_A$ open, or PD$_B$ open, or both PD$_A$ and PD$_B$ open.
Note 2: Either PD$_A$ shorted, PD$_B$ shorted, or both PD$_A$ and PD$_B$ shorted.

In the above table, conditions (2), (3), and (4) are unambiguous and definitive. Conditions (1) and (5) require further analysis. Such further analysis can be done first by lowering the voltage on bus PB$_A$ to +24.0 volts with the voltage on bus PB$_B$ kept at +26.0 volts, and then subsequently reversing the roles of the two buses. The following table summarizes the ON and OFF patterns of the LEDs of FIG. 2 under such an assumed condition where the voltage of only bus PB$_A$ is lowered to +24.0 volts.

|  | LED$_{A1}$ | LED$_{A2}$ | LED$_{B1}$ | LED$_{B2}$ | Note |
|---|---|---|---|---|---|
| (6) | X | 0 | 0 | X | Note 1 |
| (7) | 0 | X | 0 | X | Note 2 |
| (8) | X | 0 | X | 0 | Note 3 |

Note 1: Either no fault, or PD$_A$ open.
Note 2: Either PD$_B$ open or each of PD$_A$ and PD$_B$ is open.
Note 3: Either PD$_B$ shorted, or both PD$_A$ and PD$_B$ shorted and fuse F$_B$ has blown as a consequence.

In the above latter table, each of the conditions (6) and (7) may be ambiguous. That is, they may or may not be ambiguous in view of the ON and OFF pattern which prevailed before the voltage was lowered on bus PB$_A$. In any event, another test may be made by lowering the voltage on bus PB$_B$ to +24.0 volts while maintaining the voltage on bus PB$_A$ at +26.0, the results of which will remove any remaining ambiguity. The following table summarizes the ON and OFF pattern of the LEDs of FIG. 2 under such circumstances.

|  | LED$_{A1}$ | LED$_{A2}$ | LED$_{B1}$ | LED$_{B2}$ | Note |
|---|---|---|---|---|---|
| (10) | 0 | X | X | 0 | Note 1 |
| (11) | 0 | X | 0 | X | Note 2 |
| (12) | X | 0 | X | 0 | Note 3 |

Note 1: Either no fault, or PD$_B$ open.
Note 2: Either PD$_A$ open or each of PD$_A$ and PD$_B$ open.
Note 3: Either PD$_A$ shorted, or both PD$_A$ and PD$_B$ shorted and fuse F$_A$ has blown as a consequence.

Again, the above latter patterns are ambiguous with respect to information obtained from this test condition alone, but is definitive when combined with that of the foregoing two other sets of patterns. Specifically, if both patterns 7 and 11, which relate to Note 2, are obtained during the two test conditions, then both PD$_A$ and PD$_B$ are open. Similarly, if the results 5, 8 and 12 are all obtained under the three conditions, then both PD$_A$ and PD$_B$ are short-circuited.

There may well be other faults such, for example, as faulty conditions of resistances RA1 and RA2, or light emitting diodes LED$_{A1}$, LED$_{A2}$, LED$_{B1}$ and LED$_{B2}$, all of which are indicated by certain sequences of LED ON and OFF patterns.

Figure 3:
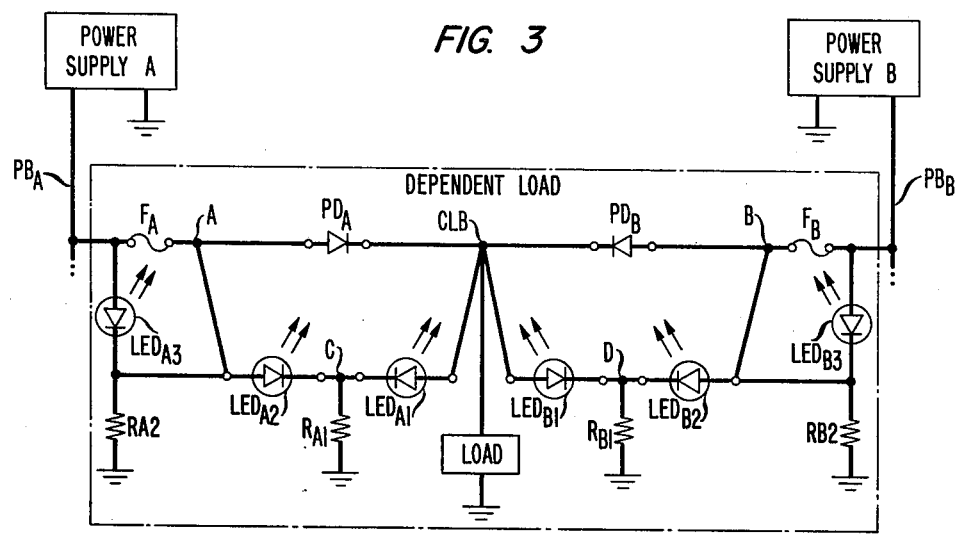
FIG. 3 illustrates how a blown fuse indicator may be added to the structure of FIG. 2.

FIG. 3 shows how the circuitry of FIG. 2 may be modified to provide an ON visual indication of the failure of fuses F$_A$ and F$_B$ which could be advantageous if the latter are not of the self-indicating type. Note that the monitor circuitry described above does give visual indication of the failure of either $F_A$, $F_B$ or both $F_A$ and $F_B$. It is sometimes considered desirable, however, to operate an indicator panel with all lights out when there is no trouble, and any ON light indicates trouble. This circuitry, combined with exchanging $LED_{A2}$ and $LED_{B2}$ for non-LEDs, operates in this way. Normally, when a fuse, such as fuse $F_A$, is operating properly it will exhibit perhaps only a 0.25 volt drop, which is not enough to cause $LED_{A3}$ to conduct sufficiently to produce a visible signal. If, however, fuse $F_A$ should become open-circuited, then $LED_{A3}$ would become fully conducting, with resistance $R_{A2}$ (2,400 ohms) limiting the current to about 10 ma, to visibly indicate a blown fuse. A similar arrangement is provided for fuse $F_B$. It will be apparent to those skilled in the art that tables similar to those previously presented may be drawn up to show any possible fault in the new circuitry as well.

Figure 4:
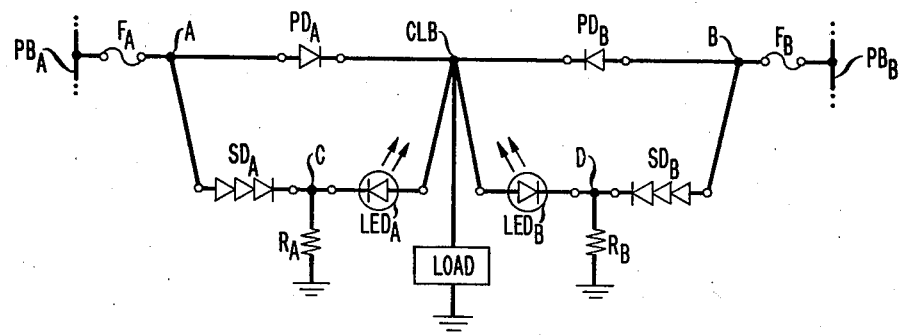
FIGS. 4 and 5 show how shifter diodes (SD) and/or light-emitting diodes (LED) may be used as control diodes.
Figure 5:
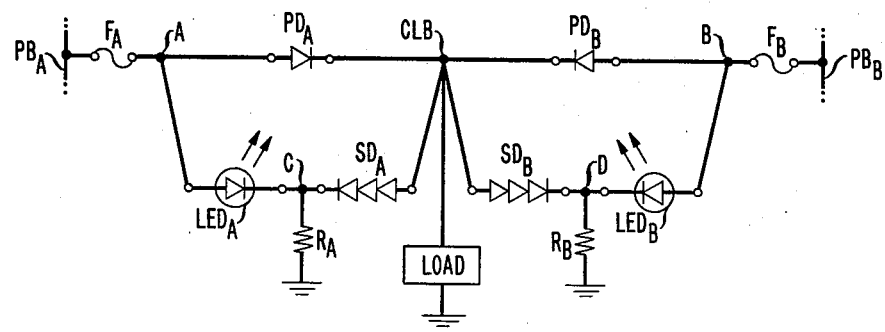

FIGS. 4 and 5 depict shifter diode and light-emitting diode combinations (as opposed to two LEDs) for detecting power diode abnormalities. A shifter diode is one which contains a multiplicity of individual diodes, chosen and connected in series as an advantageous embodiment to obtain a desired voltage versus current characteristic such as that previously chosen for $LED_{A2}$ and $LED_{B2}$.

The electrical operation of FIG. 4 circuitry is identical to that of FIG. 2. However, since $LED_{A2}$ and $LED_{B2}$ have been replaced by diodes which do not emit light, the current conduction therethrough is not visibly indicated. With one exception, all of the indications of abnormal operation depicted in the above tables have redundancies, e.g., whenever $LED_{A2}$ goes OFF, $LED_{A1}$ goes ON, so that the same information is obtained so long as either $LED_{A2}$ or $LED_{A1}$ is actually on LED.

The exception is the case where both $F_A$ and $F_B$ are blown, in which case the presence of all four LEDs (all being OFF under this condition) gives a fully-specific indication of the double failure.

If the additional circuitry shown in FIG. 3 is used instead to supply indication of both fuses being blown, then there is no information lost in the use of shifters to replace LEDs as shown in FIGS. 4 and 5. There is a design gain, however, in the ability to obtain the desired diode junction (volts versus current) characteristic more readily.

Figure 6:
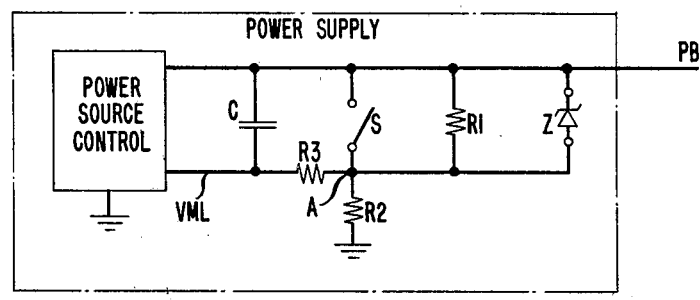
FIG. 6 shows circuitry for enabling a single slight change to be made in the voltage of a power source; and, FIG. 7 shows circuitry comparable to that of FIG. 7 but for enabling a number of slight changes to be made in the voltage of a power source.

FIG. 6 shows one way of providing a voltage for a power bus PB so that the voltage may be conveniently lowered by 2 volts in order to implement the foregoing diagnostics in the circuits of FIGS. 2 through 5. The normal voltage on bus PB is +26.0 volts with switch S open as shown. Resistances R1 and R2 are chosen to provide at node A a voltage of +24.0 volts. The Zener diode Z has a breakdown voltage of 4 volts and thus normally does not conduct. Capacitor C is normally charged to 2.0 volts with its lower terminal at +24.0 volts and its upper terminal at +26.00 volts. The voltage monitor lead VML is the voltage sensing lead which is commonly provided on self-regulating power supplies. It is normally connected at the load whose voltage is to be controlled, thus causing this voltage to be correct regardless of voltage drops in the power distribution system. The closing of switch S will cause the voltage on bus PB to slowly drop by 2 volts (such as from +26.0 volts to +24.0 volts) as capacitor C discharges under the control of the value of resistance R3. It is apparent that the time constant of C times R3 controls the rate at which capacitor C discharges. The slow voltage change obviates the transient-induced noise which could disrupt load equipment if the bus transition were fast. Operation is by virtue of the feedback control in the power source which will alter the output voltage so as to keep the voltage on lead VML a constant that has been selected by prior power supply adjustment. When S is opened, the R1—R2 voltage divider allows the power source to see only a portion of its output voltage, which it then raises to compensate. Consequently, the opening of switch S will allow capacitor C to become recharged so that the voltage on bus PB will be slowly raised from +24.0 volts to +26.0 volts. The diode Z is provided to prevent the voltage on bus PB from inadvertently rising by more than 2 volts to possibly damage load equipment being fed from bus PB. If the voltage on bus PB should rise to as much as 28 volts, due for instance to an open-circuit in resistance R1, diode Z would conduct to hold down any further rise in bus voltage. Furthermore, the failure would automatically be indicated on the LEDs since the two power buses now differ by two volts.

Figure 7:
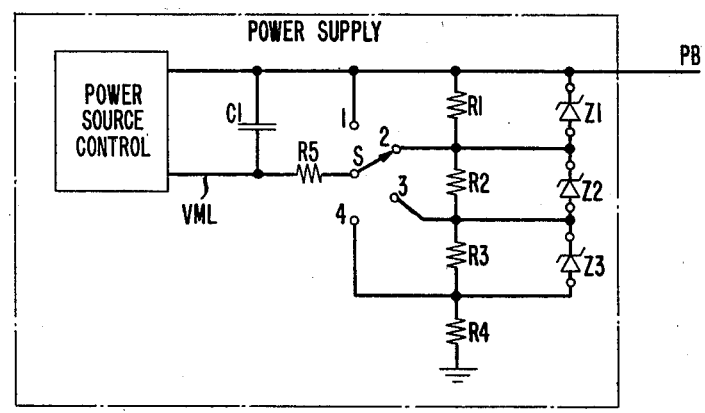

FIG. 7 shows a way of providing a multiplicity of voltage changes on bus PB if such were desired. For instance, with switch S in position 2, the bus voltage could be adjusted to +26.0 volts; with switch S moved from position 2 to position 1, the bus voltage could be lowered to +25.0 volts; with switch S moved from position 2 to position 3, the bus voltage could be raised to +27.0 volts; and, with switch S moved from position 2 to position 4, the bus voltage could be raised to +28.0 volts. It will be recalled that lowering the voltage of one of the buses in either FIG. 2 or FIG. 3 by 2 volts, one bus at a time, enabled the circuitry of the invention to provide indications of changes in the voltages on the terminals of a power diode. It will be apparent that the same situation can be accomplished by using circuits such as in FIG. 7 to effect the 2 volt change by lowering one power bus by 1 volt and raising the other power bus by 1 volt.

Circuit Equations

This section sets forth the equations which relate the required supply, component and load voltages in order to obtain circuit operation in accord with this invention.

In the explanation of the invention above, specific voltages have been used for illustration. The actual voltages used in a specific embodiment will depend on a number of parameters such as the power bus voltages, the allowable supply voltage variation for the common load equipment, the junction voltages of available diodes, etc. The relationships required among these various parameters will be described by use of the notations shown in the following table and list (Table 1), and by reference to FIG. 2. For clarity, the illustrative value which has been previously used in the text is included parenthetically following the parameter designation.

TABLE 1

|  | POWER DIODE ($PD_A$ or $PD_B$) | CONTROL DIODE 1 ($LED_{A1}$ or $LED_{B1}$) | CONTROL DIODE 2 ($LED_{A2}$ or $LED_{B2}$) | FUSE ($F_A$ or $F_B$) |
|---|---|---|---|---|
| ON VOLTAGE (Full conduction) | $V_{PD}$ (1.5v) | $V_{CD1}$ (1.3v) | $V_{CD2}$ (2.25v) | $V_F$ (.25v) |
| OFF VOLTAGE (Negligible | $v_{PD}$ | $v_{CD1}$ | $v_{CD2}$ | $v_F$ |

TABLE 1-continued

| conduction) | (.6v) | (.9v) | (1.5v) | (0v) |
|---|---|---|---|---|

$V_{BN}$   Normal bus volatge (26v)
$V_R$   The voltage reduction on a bus to create a test condition (2v)
$V_{LM}$   The minimum supply voltage for which a common load equipment is designed to operate (24v).

Normal Conditions

Both buses at $V_{BN}$; common load current shared by $PD_A$ and $PD_B$.

To guarantee that $LED_{A2}$ or $LED_{B2}$ is ON, and $LED_{A1}$ or $LED_{B1}$ is OFF:

$$V_{CD2} - V_{PD} \leq V_{CD1} \quad (1)$$

Test Condition

One bus at $V_{BN}$, and the other at the reduced test voltage which equals $V_{BN} - V_R$.

To guarantee that $LED_{A2}$ or $LED_{B2}$ is OFF, and $LED_{A1}$ or $LED_{B1}$ is ON:

$$V_F + V_{PD} + V_{CD1} - V_R \leq V_{CD2} \quad (2)$$

Load Compatibility Requirement

To guarantee that the common load equipment continues to operate correctly during a test with lowered bus voltage:

$$V_{BN} - V_F - V_{PD} - V_R \geq V_{LM} \quad (3)$$

As previously discussed, the full differential voltage ($V_R$) may be obtained, but only half of the drop $V_R$ actually applied to either bus, by simultaneously raising one bus by $V_R/2$ while dropping the other bus by $V_R/2$. It is to be understood that the above-described arrangements are illustrative of the application of the principles of the invention. Other arrangements may be devised by those skilled in the art without departing from the spirit and scope of the invention. For example, it is quite obvious that a power diode monitoring circuit other than that involving control diodes may be employed provided that some means is employed for detecting the voltages across such circuits. Also, the exemplary voltage drops across such components as fuses; power diodes, light-emitting diodes, et cetera are not limiting. Many other such parameters may be employed depending upon such factors as the nominal power bus voltage, the desired degree of control over the bus voltages, the type of circuit components, et cetera. Furthermore, while the preferred embodiment employs two light-emitting diodes for each power diodes, it is obvious that significant diagnostic information may be gleaned from a situation wherein only one of the control diodes is of the light-emitting type. In addition, while the most diagnostic information can be derived from an arrangement wherein each power diode is provided with monitoring circuitry according to the invention, it will be apparent that significant information can be derived from a situation wherein less than all of the power diodes are so arranged.

Many uses of the invention will be apparent to those skilled in the art. For instance, if the LEDs of FIGS. 2 through 5 were arranged in a definite physical configuration, such as on a display board, deviations from normal ON and OFF LED patterns would be exceptionally apparent to visual inspection because of the pattern sensitivity of the human eye. Further, if the normally-on LEDs are chosen as green-light emitting, while those which turn on only under test or failure conditions are chosen to emit red light, then deviation from the normal pattern will be yet more apparent. Also, if the LEDs were incorporated within special isolator semiconductor devices (opto-isolators), such devices could supply output voltages representative of the power diode voltage conditions and such voltages could be used for diagnostic purposes, at remote locations, or by automated monitoring equipment, e.g., a properly programmed computer.

What is claimed is:

1. A voltage monitoring arrangement for a direct-current power distribution system wherein a plurality of separate power sources supply power in parallel to a common load through separate two-terminal power diodes similarly poled for unidirectional current conduction therethrough between the source terminals of the power diodes and the common load terminals of the power diodes and wherein the sources and the load have a common power supply return characterized in that at least one power diode is provided with voltage monitoring circuitry comprising:
   (A) a first two-terminal current conducting circuit adapted to be fully conducting only in response to a prescribed first minimum amount of direct-current voltage across its terminals and to be negligibly conducting for lesser or reversed-polarity voltages;
   (B) a second two-terminal current conducting circuit adapted to be fully conducting only in response to a prescribed second minimum amount of direct-current voltage across its terminals and negligibly conducting for lesser or reversed-polarity voltages; and
   (C) a two-terminal, direct-current impedance;
   (D) one terminal of each of the first circuit being connected to a common circuit node, the corresponding terminal of said second circuit being connected to the same common node; and one of said terminals of said impedance being connected to said common circuit node;
   (E) the other terminals of the respective first circuit, second circuit, and impedance being connected respectively to the load terminal of the power diode, to the source terminal of the power diode, and to the common return; and,
   (F) the impedance being of such value as to limit to prescribed maxima the fully conducting amounts of current through the first and second circuits.

2. The invention defined in claim 1 wherein the respective power diode, first circuit, and second circuit having respective fully conducting voltages thereacross of $V_{PD}$, $V_{CD1}$, $V_{CD2}$ related so that said respective first circuit and said second circuit have maximum respective voltages $v_{C1}$ and $v_{C2}$ thereacross during nonconduction thereof, and a voltage is supplied to said source terminal of said last mentioned power diode; and being related so that $V_{CD2} - V_{PD}$ is less than or equal to $v_{CD1}$.

3. A voltage monitoring arrangement for a direct-current power distribution system wherein a plurality of separate power sources supply power in parallel to a common load through separate two-terminal power diodes similarly poled for unidirectional current conduction therethrough between the source terminals of the power diodes and the common load terminals of the power diodes and wherein the sources and the load have a common power supply return characterized in that each of said power diodes is provided with voltage monitoring circuitry comprising:
(A) a first two-terminal current conducting circuit adapted to be fully conducting only in response to a prescribed first minimum amount of direct-current voltage across its terminals;
(B) a second two-terminal current conducting circuit adapted to be fully conducting only in response to a prescribed second minimum amount of direct-current voltage across its terminals; and,
(C) a two-terminal, direct-current impedance;
(D) corresponding terminals of each of the first and second circuits, and one terminal of the impedance being connected together to define a common circuit node;
(E) the other terminals of the respective first circuit, second circuit, and impedance being connected respectively to the load terminal of the power diode, to the source terminal of the power diode, and to the common return;
(F) the impedance being of such value as to limit to prescribed maxima the fully conducting amounts of current through the first and second circuits; each of said power diodes, first circuit, and second circuit having respective fully conducting voltages thereacross of $V_{PD}$, $V_{CD1}$, $V_{CD2}$ related so that said respective first circuit and said second circuit have maximum respective voltages $v_{CD1}$ and $v_{CD2}$ thereacross during nonconduction thereof, and a voltage is supplied to said last terminal of said last mentioned power diode; and being related so that $V_{CD2} - V_{PD}$ is less that or equal to $v_{CD1}$, and $V_{BN}$ being said voltage supplied to said source terminal of one of said power diodes and said voltage supplied to said source terminal of another one of said power diodes being $V_{BN} - V_R$ where $V_R$ is a voltage reduction; and being related so that for each said voltage monitoring circuitry $V_{PD} + V_{CD1} - V_R$ is less than or equal to $v_{CD2}$.

4. The invention defined in claim 3 wherein $V_{LM}$ is a minimum voltage for which said common load operates and for each said monitoring circuitry $V_{BN} - V_{PD} - V_R$ is greater than or equal to $V_{LM}$.

5. The invention defined in claim 1 wherein
(A) each of the first and second circuits is a unidirectional, current-conducting circuit;
(B) the first and second circuits are similarly poled with respect to the common node; and,
(C) the power diode and the first circuit are oppositely poled with respect to the load terminal of the power diode.

6. The invention defined in claim 5 wherein:
(A) the first circuit comprises a first unidirectional current conducting device;
(B) the second circuit comprises a second unidirectional current conducting device; and,
(C) $V_{CD1}$ and $V_{CD2}$ are the respective voltages across the respective first circuit and second circuit when the respective first device and second device are fully conducting.

7. The invention defined in claim 6 wherein:
(A) the first device is a first control diode and
(B) the second device is a second control diode.

8. The invention defined in claim 7 wherein:
(A) the first circuit consists solely of the first control diode;
(B) the second circuit consists solely of the second control diode; and,
(C) $V_{CD1}$ and $V_{CD2}$ are the respective voltages across the respective first and second control diodes when the control diodes are fully conducting.

9. The invention defined in claim 8 wherein at least one of the first and second control diodes is a light-emitting diode which emits a detectable amount of light when fully conducting.

10. The invention defined in claim 9 wherein each of the first and second control diodes is a light-emitting diode which emits a detectable amount of light when fully conducting.

11. The invention defined in claim 10 wherein each separate power diode is provided with a separate said voltage monitoring circuitry.

12. The invention defined in claim 11 wherein the plurality of separate power sources consists of two such sources.

13. A voltage monitoring arrangement for a direct-current power distribution system wherein a plurality of separate power sources supply power at the same amount and polarlity of direct-current potential in parallel to a common load through separate two-terminal power diodes similarly poled for unidirectional current conduction therethrough between the source terminals of the power diodes and the common load terminals of the power diodes, wherein eachh power diode has a direct-current voltage drop thereacross of $V_{PD}$ when fully conducting, wherein the sources and the load have a common power supply return, and a voltage V is supplied to a source terminal of each said power diode characterized in that at least one power diode is provided with voltage monitoring circuitry comprising:
(A) a first two-terminal current conducting circuit having
 (1) a direct-current voltage drop thereacross of $V_{CD1}$ when fully conducting
 (2) and a maximum direct-current voltage drop thereacross of not more than $v_{CD1}$ when negligibly conducting;
(B) a second two-terminal current conducting circuit having
 (1) a direct-current voltage drop thereacross of $V_{CD2}$ when fully conducting
 (2) and a direct-current voltage drop thereacross of not more than $v_{CD2}$ when negligibly conducting;
(C) a two-terminal, direct-current impedance;
(D) one terminal of each of the first circuit, the corresponding terminal of the second circuit, and the impedance being connected together to define a common circuit node;
(E) the other terminal of the respective first circuit, second circuit, and impedance being connected respectively to the load terminal of the power diode, to the source terminal of the power diode, and to the common return;
(F) the impedance being of such value as to limit to prescribed maximum the fully conducting amounts of current through the first and second circuits; and $V_{PD}$, $V_{CD1}$, $v_{CD1}$, $V_{CD2}$, and $v_{CD2}$ being related so that
 (1) $V_{CD2}$ minus $V_{PD}$ is not greater than $v_{CD1}$; and
 (2) $V_{PD}$ plus $V_{CD1}$ minus $V_R$ is not greater than $v_{CD2}$ where $V_R$ is a reduction in said voltage direct-current voltage V supplied to said source terminal of said power diode.

14. The invention defined in claim 13 wherein:

(A) each of the first and second circuits is a unidirectional, current- conducting circuit;
(B) the first and second circuits are similarly poled with respect to the common node;
(C) and, the power diode and the first circuit are oppositely poled with respect to the load terminal of the power diode.

15. The invention defined in claim 14 wherein
(A) the respective first and second circuits comprise respective first and second unidirectional, current-conducting devices
(B) and the respective $V_{CD1}$ and $V_{CD2}$ are the respective voltage drops across the respective first and second circuits when the respective first and second devices are fully conducting.

16. The invention defined in claim 15 wherein the respective first and second devices are respective first and second control diodes.

17. The invention defined in claim 16 wherein
(A) the respective first and second circuits consist solely of the respective first and second control diodes
(B) and the respective $V_{CD1}$ and $V_{CD2}$ are the respective voltages drops across the respective first and second control diodes when the latter are fully conducting.

18. The invention defined in claim 17 wherein at least one of the first and second control diodes is a light-emitting diode which emits an appreciably greater amount of light when fully conducting than when negligibly conducting.

19. The invention defined in claimm 18 wherein the other control diode is a shifter diode.

20. The invention defined in claim 18 wherein the other control diode is also such a light-emitting diode.

* * * * *